United States Patent [19]
Wu

[11] Patent Number: 5,982,001
[45] Date of Patent: Nov. 9, 1999

[54] MOSFETS STRUCTURE WITH A RECESSED SELF-ALIGNED SILICIDE CONTACT AND AN EXTENDED SOURCE/DRAIN JUNCTION

[75] Inventor: Shye-Lin Wu, Hsinchu, Taiwan

[73] Assignee: Texas Instruments - Acer Incorporated, Hsinchu, Taiwan

[21] Appl. No.: 09/050,668

[22] Filed: Mar. 30, 1998

[51] Int. Cl.⁶ .................................................. H01L 29/72
[52] U.S. Cl. ........................ 257/344; 257/384; 257/412
[58] Field of Search ................................... 257/344, 382, 257/383, 384, 412, 413, 960, 336, 337, 346

[56] References Cited

U.S. PATENT DOCUMENTS

| | | | |
|---|---|---|---|
| 5,397,909 | 3/1995 | Moslehi | 257/383 |
| 5,444,282 | 8/1995 | Yamaguchi et al. | 257/344 |
| 5,739,573 | 4/1998 | Kawaguchi | 257/384 |
| 5,841,173 | 11/1998 | Yamashita | 257/384 |
| 5,883,418 | 3/1999 | Kimura | 257/412 |

*Primary Examiner*—Donald L. Monin, Jr.
*Attorney, Agent, or Firm*—Harness, Dickey & Pierce, P.L.C.

[57] ABSTRACT

The MOSFETS structure includes a field oxide region formed on a silicon substrate. A gate includes a silicon dioxide layer formed on the silicon substrate, a first conductive layer formed on the silicon dioxide layer, a second oxide layer formed on the silicon dioxide layer and abutting to the first conductive layer and a first silicide layer formed on the first conductive layer and the second oxide layer. A pad oxide layer is formed on the silicon substrate and abutting to the silicon dioxide layer. An extended source/drain junction is formed under the pad oxide layer and abutting to the pad oxide layer, wherein one side of the extended source/drain junction is aligned with one side of the first conductive layer. A second silicide layer is formed between the field oxide region and the pad oxide layer, wherein the second silicide layer abutting to the field oxide region and the pad oxide layer. A first metal layer is formed right under the second silicide layer and aligned with the second silicide layer. A fourth oxide layer is formed on the field oxide region, the first silicide layer, the second silicide layer and the pad oxide layer, wherein the fourth oxide layer has three contact holes to expose three portions of the first silicide layer and the second silicide layer. A second metal layer is formed on the fourth oxide layer and filled in the contact hole.

16 Claims, 4 Drawing Sheets

MOSFETS STRUCTURE WITH A RECESSED SELF-ALIGNED SILICIDE CONTACT AND AN EXTENDED SOURCE/DRAIN JUNCTION

FIELD OF THE INVENTION

The present invention relates to Metal Oxide Semiconductor Field Effect Transistors (MOSFETS), and especially to a method of fabricating MOSFETS with a recessed self-aligned silicide contact and an extended source/drain junction.

BACKGROUND OF THE INVENTION

Recently, the progress of semiconductor technology has driven the integrated circuits technologies toward Ultra Large Scale Integration (ULSI). In ULSI, some negative effects result from the higher integration of devices and the smaller scale of devices. Following the example of MOSFETS, the sheet resistance between the source and drain will increase when the integration of devices is high. It is adverse for high speed operation of MOSFETS. Moreover, the "short channel effect" will occur when the scale of devices is small.

So, the self-aligned silicide (SALICIDE) technology is widely use to increase the packing density of ULSI circuits and to reduce the interconnect for high speed operation. One of some articles relates to the self-aligned silicide (SALICIDE) technology. Please see "A Thermally Stable Ti-W Salicide for Deep-Submicron Logic with Embedded DRAM, 1996, IEEE, IEDM 96-451". The above article found that Ti-5% W salicide has high-thermal stability up to 800° C. as well as sheet resistance for 0.18 $\mu$m devices. However, the SALICIDE process will result in a higher junction leakage due to the metal penetration into Si substrate to spike the junction and/or the residual metal or silicide across the lightly doped drain (LDD) spacer causing a bridge effect between the adjacent devices. One of some articles relates to the above problems. Please see "Process Limitation and Device Design Tradeoffs of Self-Aligned TiSi$_2$ Junction Formation in Submicrometer CMOS Devices, IEEE TRANSACTIONS ON ELECTRON DEVICES. VOL.38. NO.2. FEBRUARY. 1991".

As for "short channel effect", it could be improved by using the extended ultra-shallow source/drain junction. One of some articles relates to the above problems. Please see "A 0.05 $\mu$m-CMOS with Ultra Shallow Source/Drain Junctions Fabricated by 5 Kev Ion Implantation and Rapid Thermal Annealing, 1994, IEEE, IEDM 94-485".

So, solving above problems is required.

SUMMARY OF THE INVENTION

According to one embodiment of the present invention, a single crystal silicon substrate with a <100> crystallographic orientation is provided. A field oxide region is grown on the substrate to provide isolation between devices on the substrate. Then, a silicon dioxide layer, a first conductive layer and a first oxide layer are formed on the silicon substrate, respectively. Then, portions of the silicon dioxide layer, the first conductive layer and the first oxide layer are removed via lithography and etching steps to define a gate region of transistors. Next, a pad oxide layer is grown on the silicon substrate and a second oxide layer is grown on a side of the first conductive layer to recover the etching damages.

Then, a nitride spacer is formed on a side of the gate region and a third oxide layer is formed in the silicon substrate. The third oxide layer is removed to perform a recessed surface on the silicon substrate. Then, the first oxide layer is removed. Next, a first metal layer is deposited on the silicon substrate and then a source/drain/gate implantation is performed via ion implantation. Subsequently, a silicidation process is used to convert portions of the first metal layer into the silicide layer, portions of the first metal layer on the field oxide and on a side of the nitride spacer being unreacted. Then, the unreacted portions of the first metal layer are removed. Next, an ion implantation is performed to form an extended source/drain junction. Subsequently, a fourth oxide layer is formed. Next, the fourth oxide layer is condensed and the silicide layer is annealed into a stable phase by rapid thermal process (RTP). Then, portions of the fourth oxide layer are removed to form a contact hole. Subsequently, a second metal layer is deposited on the fourth oxide layer and in the contact hole. Finally, portions of the second metal layer are removed.

The MOSFETS structure includes a field oxide region formed on a silicon substrate. A gate includes a silicon dioxide layer formed on the silicon substrate, a first conductive layer formed on the silicon dioxide layer, a second oxide layer formed on the silicon dioxide layer and abutting to the first conductive layer and a first silicide layer formed on the first conductive layer and the second oxide layer. A pad oxide layer is formed on the silicon substrate and abutting to the silicon dioxide layer. An extended source/drain junction is formed under the pad oxide layer and abutting to the pad oxide layer, wherein one side of the extended source/drain junction is aligned with one side of the first conductive layer. A second silicide layer is formed between the field oxide region and the pad oxide layer, wherein the second silicide layer abutting to the field oxide region and the pad oxide layer. A first metal layer is formed right under the second silicide layer and aligned with the second silicide layer. A fourth oxide layer is formed on the field oxide region, the first silicide layer, the second silicide layer and the pad oxide layer, wherein the fourth oxide layer has three contact holes to expose three portions of the first silicide layer and the second silicide layer. A second metal layer is formed on the fourth oxide layer and filled in the contact hole.

DETAILED DESCRIPTION OF THE PREFERRED EMBODIMENT

Figure 1:
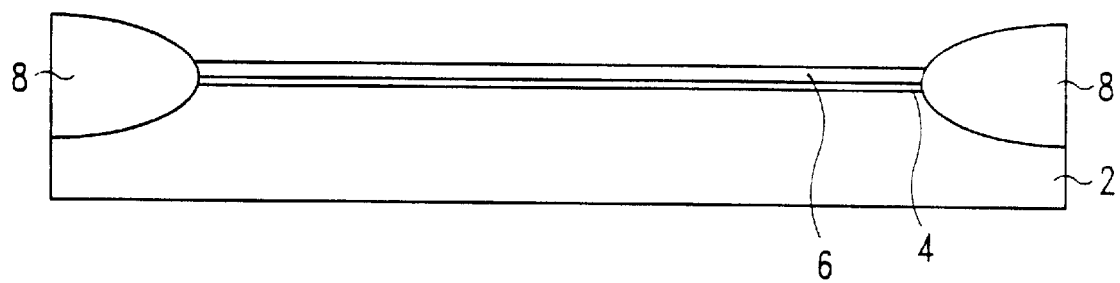
FIG.1 is a cross-sectional view of forming a silicon dioxide layer, a nitride layer and a field oxide region on a silicon substrate in accordance with the present invention.

The present invention discloses a method of fabricating MOSFETS with a recessed self-aligned silicide contact and an extended source/drain junction. The more detail description of the present invention will be seen as follows:

Referring to FIG.1, a single crystal silicon substrate 2 with a <100> crystallographic orientation is provided. A silicon dioxide layer 4 is grown on the silicon substrate 2 by using thermal oxidation process. A silicon nitride layer 6 is deposited on the silicon dioxide layer 4 by using low pressure chemical vapor deposition (LPCVD). Then, portions of the silicon nitride layer 6 are removed. A field oxide region 8 is grown on the silicon substrate 2 via lithography and etching steps to etch a silicon nitride-silicon dioxide composition layer by thermal oxidation process. The field oxide region 8 can provide isolation between devices on the substrate 2.

Figure 2:
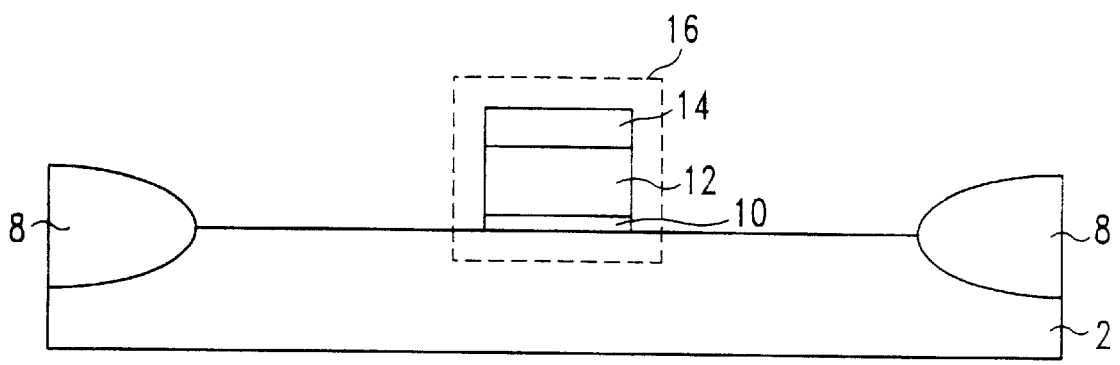
FIG.2 is a cross-sectional view of defining a gate region of transistors in accordance with the present invention.
Figure 3:
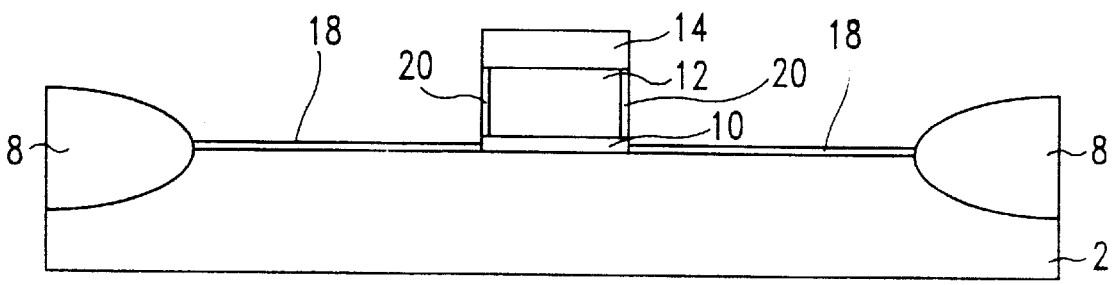
FIG.3 is a cross-sectional view of forming a pad oxide layer on the silicon substrate and a second oxide layer on a side of the first conductive layer to recover the etching damages in accordance with the present invention.

Referring to FIG.2, the silicon dioxide layer 4 and the silicon nitride layer 6 are removed via etching step. Then, a silicon dioxide layer 10 is grown by thermal oxidation process on the silicon substrate 2. The silicon dioxide layer 10 is used as the gate oxide. Then, a first conductive layer 12 is formed on the field oxide region 8 and the silicon dioxide layer 10 via LPCVD. Next, a first oxide layer 14 is formed on the first conductive layer via LPCVD. Then, portions of the silicon dioxide layer 10, the first conductive layer 12 and the first oxide layer 14 are removed via lithography and etching steps, a gate region of transistors 16 can be defined. In a preferred embodiment, the first conductive layer 12 comprises doped polysilicon. The thickness of the first conductive layer 12 is about 500–5000 angstroms. And the first oxide layer 14 is formed of tetra-ethyl-orthosilicate (TEOS) oxide. The thickness of the first oxide layer 14 is about 300–1500 angstroms. Referring to FIG.3, a pad oxide layer 18 is grown on the silicon substrate 2 and a second oxide layer 20 is grown on a side of the first conductive layer 12 by using thermal oxidation process in the $N_2O$ or NO ambient to recover the etching damages. Preferably, the temperature of thermal oxidation process is about 750–1100° C., the thickness of the pad oxide layer 18 is about 20–150 angstroms and the thickness of the second oxide layer 20 is about 40–250 angstroms.

Figure 4:
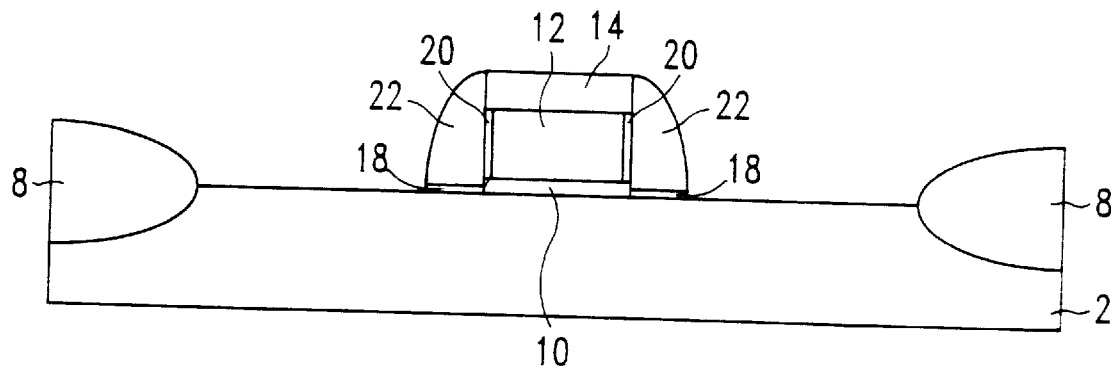
FIG.4 is a cross-sectional view of forming a nitride spacer on a side of the gate region in accordance with the present invention.
Figure 5:
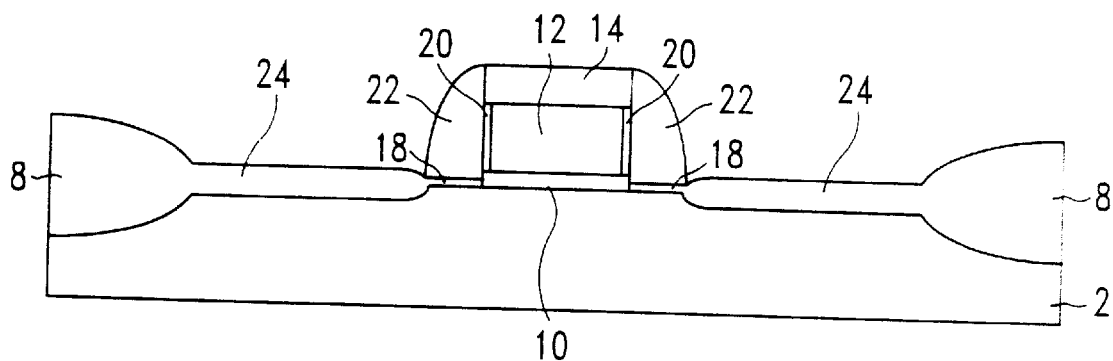
FIG.5 is a cross-sectional view of forming a third oxide layer in the silicon substrate in accordance with the present invention.

Turning to FIG.4, a first nitride layer 22 is deposited on the field region 8, the pad oxide layer 18 and the gate region of transistors 16. Then, portions of the first nitride layer 22 and the pad oxide layer are removed to form a nitride spacer 22. In one embodiment of the present invention, the thickness of the first nitride layer 22 is about 500–2000 angstroms. And the first nitride layer 22 is deposited by using LPCVD or PECVD systems. Referring to FIG.5, a third oxide layer 24 is grown in the silicon substrate 2 by thermal oxidation process. In one embodiment of the present invention, the temperature of thermal oxidation process is about 800–1100° C., the thickness of the third oxide layer 24 is about 300–2000 angstroms.

Figure 6:
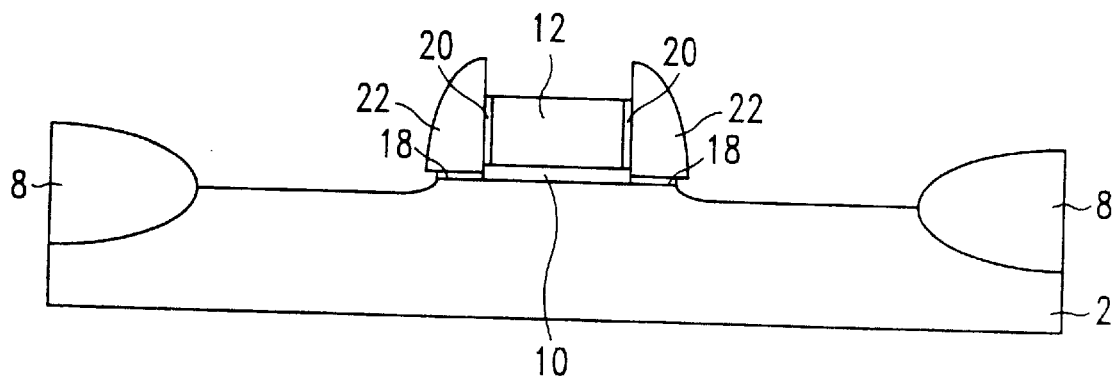
FIG.6 is a cross-sectional view of removing the third oxide layer and the first oxide layer in accordance with the present invention.
Figure 7:
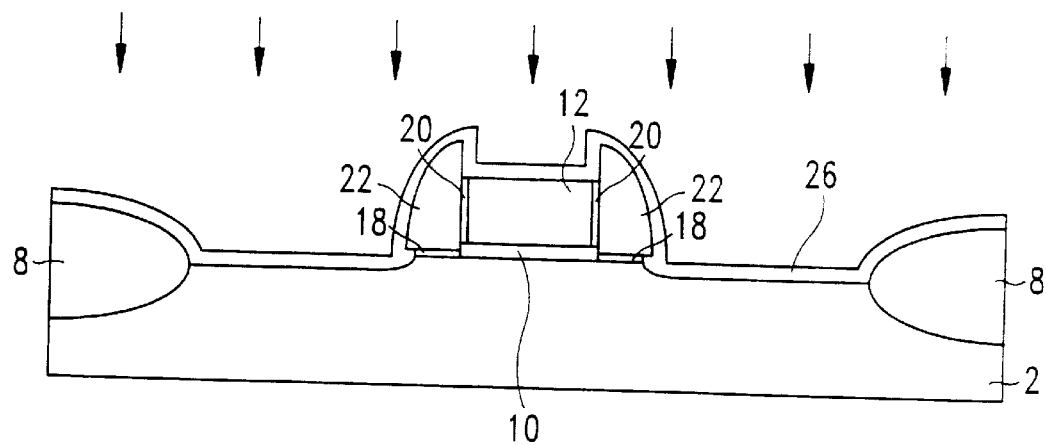
FIG.7 is a cross-sectional view of depositing a first metal layer and then performing a source/drain/gate via ion implantation in accordance with the present invention.
Figure 8:
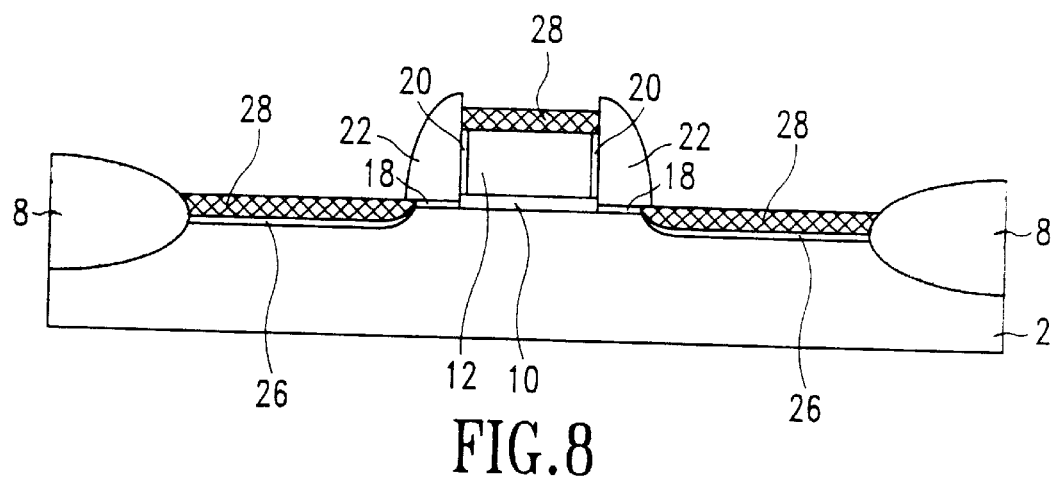
FIG.8 is a cross-sectional view of converting portions of the first metal layer into a silicide layer and then removing the unreacted portions of the first metal layer in accordance with the present invention.
Figure 9:
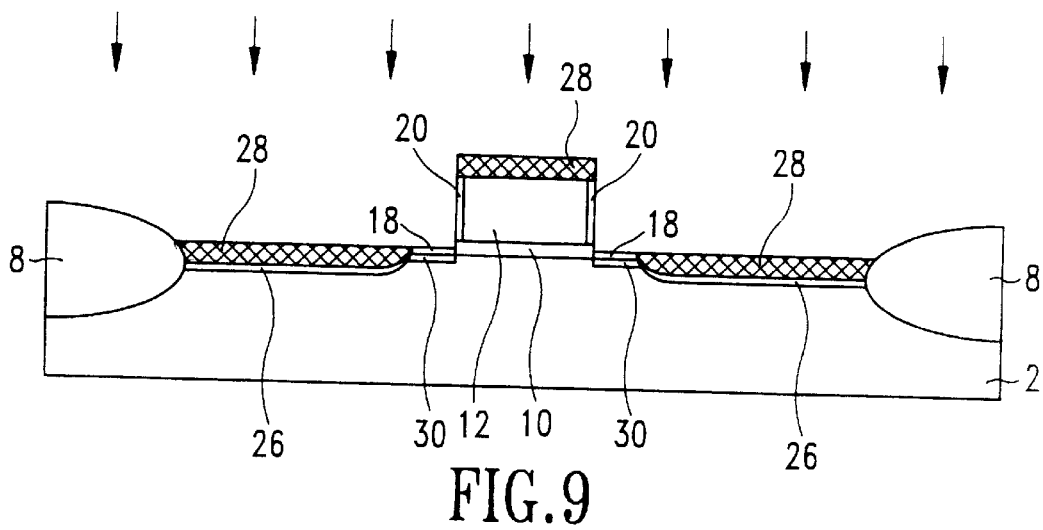
FIG.9 is a cross-sectional view of removing the nitride spacer and then performing an ion implantation to form an extended source/drain junction in accordance with the present invention.
Figure 10:
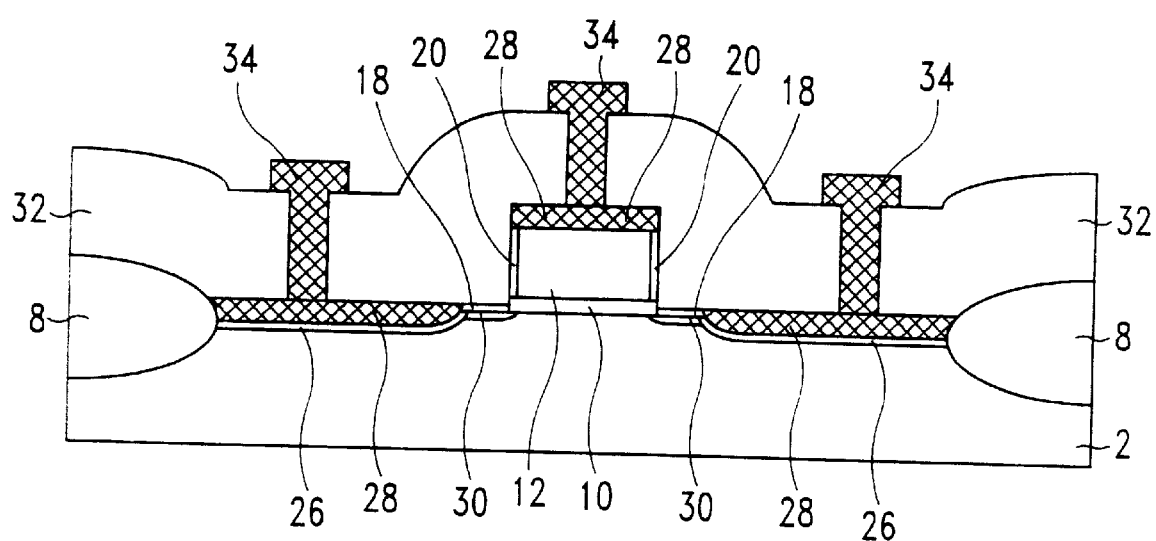
FIG.10 is a cross-sectional view of depositing a fourth oxide layer and then performing the metallization in accordance with the present invention.

Referring to FIG.6, the third oxide layer 24 is removed to perform a recessed surface on the silicon substrate 2. Then, the first oxide layer 14 is removed. Preferably, the etching step is by wet etching and the etchant of the etching is Buffer Oxide Etching (BOE) solution. Turning to FIG.7, a first metal layer 26 is deposited on the silicon substrate 2 and then a source/drain/gate implantation is performed via ion implantation. In one embodiment of the present invention, the first metal layer 26 is Ti, W, Co, Pt, Ni or Cr. The first metal layer 26 is deposited by using PVD or CVD systems. The thickness of the first metal layer 26 is about 100–1000 angstroms. The energy of ion implantation is about 10–120 KeV. And the dosage of implantation is about $10^{14}$–$5\times10^{16}$ cm$^{-2}$. Referring to FIG.8, a silicidation process is used to convert portions of the first metal layer 26 into the silicide layer 28, portions of the first metal 26 on the field 8 and on a side of the nitride spacer 22 being unreacted. Then, the unreacted portions of the first metal 26 are removed. Preferably, the temperature of the silicidation process is about 350–700° C. The unreacted portions of the first metal 26 are removed by chemical wet etching solution. Referring to FIG.9, the nitride spacer 22 is removed by hot $H_3PO_4$ solution. Then, an ion implantation is performed to form an extended source/drain junction 30. Preferably, the energy and dosage of ion implantation are about 0.5–30 KeV and $5\times10^{13}$–$2\times10^{15}$ cm$^{-2}$, respectively. Turning to FIG.10, a fourth oxide layer 32 is deposited by LPCVD or PECVD systems. Then, the fourth oxide layer 32 is condensed and the silicide layer 28 is annealed into a stable phase by rapid thermal process (RTP). Then, portions of the fourth oxide layer 32 are removed via lithography and etching processes to form a contact hole. Then, a second metal layer 34 is deposited on the fourth oxide layer 32 and in the contact hole. Finally, portions of the second metal layer 34 are removed. In one embodiment of the present invention, the temperature of thermal oxidation is about 700–950° C., the time of thermal oxidation is about 10–60 minutes. And the second metal layer 34 is Al, W, Ct, Ti, Pt, Cr, or Ni.

The MOSFETS structure includes a field oxide region formed on a silicon substrate. A gate includes a silicon dioxide layer formed on the silicon substrate, a first conductive layer formed on the silicon dioxide layer, a second oxide layer formed on the silicon dioxide layer and abutting to the first conductive layer and a first silicide layer formed on the first conductive layer and the second oxide layer. A pad oxide layer is formed on the silicon substrate and abutting to the silicon dioxide layer. An extended source/drain junction is formed under the pad oxide layer and abutting to the pad oxide layer, wherein one side of the extended source/drain junction is aligned with one side of the first conductive layer. A second silicide layer is formed between the field oxide region and the pad oxide layer, wherein the second silicide layer abutting to the field oxide region and the pad oxide layer. A first metal layer is formed right under the second silicide layer and aligned with the second silicide layer. A fourth oxide layer is formed on the field oxide region, the first silicide layer, the second silicide layer and the pad oxide layer, wherein the fourth oxide layer has three contact holes to expose three portions of the first silicide layer and the second silicide layer. A second metal layer is formed on the fourth oxide layer and filled in the contact hole.

The benefits of the present invention are increasing the operation speed by using the self-aligned silicide source/drain contact and improving the short channel effect by using the extended ultra-shallow source/drain junctions.

As will be understood by a person skilled in the art, the foregoing preferred embodiment of the present invention is illustrated of the present invention rather than limiting of the present invention. Although the preferred embodiment of the invention has been illustrated and described, it will be obvious to those skilled in the art that various changes can be made therein without departing from the spirit which is intended to be limited solely by the appended claims.

I claim:

1. A Metal oxide semiconductor field effect transistor (MOSFET) structure with a recessed self-aligned silicide contact and an extended source/drain junction, said MOSFET structure comprising:

a silicon substrate having a field oxide region formed therein;

a gate including a silicon dioxide layer formed on said silicon substrate, a first conductive layer formed on said silicon dioxide layer, a second oxide layer formed on said silicon dioxide layer and abutting to said first conductive layer and a first silicide layer formed on said first conductive layer and said second oxide layer;

a pad oxide layer formed on said silicon substrate and abutting to said silicon dioxide layer;

an extended source/drain junction formed under said pad oxide layer and abutting to said pad oxide layer, wherein one side of said extended source/drain junction is aligned with one side of said first conductive layer;

a second silicide layer formed between said field oxide region and said pad oxide layer, wherein said second silicide layer abutting to said field oxide region and said pad oxide layer;

a first metal layer formed right under said second silicide layer and aligned with said second silicide layer;

a fourth oxide layer formed on said field oxide region, said first silicide layer, said second silicide layer and said pad oxide layer, wherein said fourth oxide layer has three contact holes to expose three portions of said first silicide layer and said second silicide layer;

a second metal layer formed on said fourth oxide layer and filled in the contact hole.

2. The structure as claim 1, wherein said first conductive layer comprises doped polysilicon.

3. The structure as claim 1, wherein said pad oxide layer comprises silicon dioxide.

4. The structure as claim 1, wherein said second oxide layer comprises polysilicon oxide.

5. The structure as claim 1, wherein said first metal layer comprises Ti.

6. The structure as claim 1, wherein said first metal layer comprises W.

7. The structure as claim 1, wherein said first metal layer comprises Co.

8. The structure as claim 1, wherein said first metal layer comprises Pt.

9. The structure as claim 1, wherein said first metal layer comprises Ni.

10. The structure as claim 1, wherein said first metal layer comprises Cr.

11. The structure as claim 1, wherein said first metal layer comprises Ti.

12. The structure as claim 1, wherein said first metal layer comprises W.

13. The structure as claim 1, wherein said first metal layer comprises Co.

14. The structure as claim 1, wherein said first metal layer comprises Pt.

15. The structure as claim 1, wherein said first metal layer comprises Ni.

16. The structure as claim 1, wherein said first metal layer comprises Cr.

* * * * *